US006549396B2

(12) United States Patent
Brown

(10) Patent No.: US 6,549,396 B2
(45) Date of Patent: Apr. 15, 2003

(54) MULTIPLE TERMINAL CAPACITOR STRUCTURE

(75) Inventor: David Richard Brown, Burlington (CA)

(73) Assignee: Gennum Corporation (CA)

( * ) Notice: Subject to any disclaimer, the term of this patent is extended or adjusted under 35 U.S.C. 154(b) by 8 days.

(21) Appl. No.: 09/838,412

(22) Filed: Apr. 19, 2001

(65) Prior Publication Data

US 2002/0163769 A1 Nov. 7, 2002

(51) Int. Cl.[7] .......................... H01G 4/228; H01G 2/12
(52) U.S. Cl. ...................................... 361/306.3; 361/15
(58) Field of Search .............................. 361/15, 16, 17, 361/301.1, 306.1, 306.3

(56) References Cited

U.S. PATENT DOCUMENTS

| | | |
|---|---|---|
| 4,916,576 A | 4/1990 | Herbert et al. |
| 5,629,655 A | 5/1997 | Dent |
| 5,910,879 A * | 6/1999 | Herbert .................... 361/306.1 |
| 6,243,253 B1 * | 6/2001 | DuPre et al. ............. 361/306.3 |
| 6,266,229 B1 * | 7/2001 | Naito et al. .............. 361/306.3 |

* cited by examiner

Primary Examiner—Matthew Nguyen
(74) Attorney, Agent, or Firm—Jones Day

(57) ABSTRACT

A capacitive device formed on a substrate is provided that comprises a first set of terminals and a second set of terminals. The first set of terminals comprises a positive input terminal and a negative input terminal. The second set of terminals comprises a positive output terminal and a negative output terminal. The capacitor structure further comprises a first film electrode layer disposed above the substrate and having an input side and an output side, the input side having means for providing a coupling location for the negative input terminal, the output side having means for providing a coupling location for the negative output terminal. The capacitor structure further comprises a second film electrode layer also disposed above the substrate and having an input side and an output side, the input side having means for providing a coupling location for the positive input terminal, the output side having means for providing a coupling location for the positive output terminal. The capacitor structure also comprises a layer of film dielectric material disposed between the first film electrode layer and the second film electrode layer.

24 Claims, 6 Drawing Sheets

MULTIPLE TERMINAL CAPACITOR STRUCTURE

BACKGROUND OF THE INVENTION

1. Field of the Invention

The present invention relates to multi-layer capacitor structures. More specifically, the invention relates to a novel multi-terminal capacitor structure.

2. Description of the Related Art

As the speed at which integrated circuits are operated increases, the generation of associated switching noise increases. Switching noise, however, can have a very detrimental effect on the performance of integrated circuits. Digital integrated circuits require both stable voltage references and uniform power distribution among all integrated logic devices for signal definition. Moreover, in mixed systems having both analog and digital circuits, the switching noise generated by the digital circuits can also have a detrimental effect on the analog circuits. In many instances, reducing the effects of the digital circuits on the analog circuits in a mixed system is a very challenging problem for system designers.

Discrete capacitors are commonly used for local power supply decoupling of integrated circuits to reduce the effects of switching noise. But, current capacitive methods and structures may be inadequate for reducing noise on integrated circuits, especially at higher frequencies of operation.

A known technique for reducing switching noise is to utilize decoupling capacitors between associated voltage pins. It is known that switching noise of a circuit can be reduced by minimizing the inductance while maximizing the capacitance of an electrical path that exists between the power and ground terminals. Discrete capacitors are typically used as decoupling capacitors.

The use of discrete capacitors has a number of inherent limitations. Discrete capacitors are two-terminal devices which unavoidably use extrinsic leads. The resistance and inductance of these leads place a lower bound on the capacitor's high-frequency impedance. Furthermore, the self-resonance of discrete capacitors limits the useful bandwidth over which electrical disturbances can be attenuated. Moreover, because a discrete capacitor is necessarily mounted a certain distance away from the semiconductor chip, it is electrically coupled to the voltage pins by a plurality of power wiring lines or large power buses which typically represent high induction paths which add to the effective inductance of the electrical path. In addition, as the amount of current flowing in the plurality of wiring lines increases, a voltage drop is produced across the wires which adds additional power distribution noise.

Therefore there remains a need in this art for an improved capacitor structure for reducing electrical noise such as switching noise.

SUMMARY OF THE INVENTION

The present invention meets the foregoing needs by providing a multi-terminal capacitor structure that reduces the capacitor's intrinsic series inductance by making use of a signal flow through arrangement. The preferred embodiment also provides a capacitor structure that can take advantage of flip chip circuit arrangements to reduce the extrinsic series inductance the capacitor could otherwise add to a circuit. The preferred capacitor structure also provides a mechanism whereby both the input impedance and the output impedance of the capacitor structure can be customized for better matching with power supply impedance and the associated interconnect impedance.

The present invention provides many advantages over the presently known capacitor structures. Not all of these advantages are simultaneously required to practice the invention as claimed, and the following list is merely illustrative of the types of benefits that may be provided, alone or in combination, by the present invention. These advantages include: (1) providing high-quality decoupling and electrical isolation of noisy power supply networks over a broad spectrum of frequencies thereby providing sub-component isolation; (2) the ability to customize both the input impedance and the output impedance of the capacitor structure thereby providing tuned terminations; (3) independent impedance looking into each pair of terminals; (4) avoidance of discrete capacitors leading to reduced system size; (5) application-specific optimization of sub-component isolation.

In accordance with one aspect of the present invention, a thin film capacitor structure is provided that comprises a first set of terminals and a second set of terminals. The first set of terminals comprises a positive input terminal and a negative input terminal. The second set of terminals comprises a positive output terminal and a negative output terminal. The capacitor structure further comprises a first electrode assembly coupled between the positive input terminal and the positive output terminal and a second electrode assembly coupled between the negative input terminal and the negative output terminal. Electrical energy available at the second set of terminals flows from the first set of terminals to the second set of terminals across said first and second electrode assemblies.

In accordance with another aspect of the present invention, a capacitive device formed on a substrate is provided that comprises a first set of terminals and a second set of terminals. The first set of terminals comprises a positive input terminal and a negative input terminal. The second set of terminals comprises a positive output terminal and a negative output terminal. The capacitor structure further comprises a first film electrode layer disposed above the substrate and having an input side and an output side, the input side having means for providing a coupling location for the negative input terminal, the output side having means for providing a coupling location for the negative output terminal. The capacitor structure further comprises a second film electrode layer also disposed above the substrate and having an input side and an output side, the input side having means for providing a coupling location for the positive input terminal, the output side having means for providing a coupling location for the positive output terminal. The capacitor structure also comprises a layer of film dielectric material disposed between the first film electrode layer and the second film electrode layer.

BRIEF DESCRIPTION OF THE DRAWINGS

The present invention will become more apparent from the following description when read in conjunction with the accompanying drawings wherein.

DETAILED DESCRIPTION OF THE PREFERRED EMBODIMENT

Figure 1:
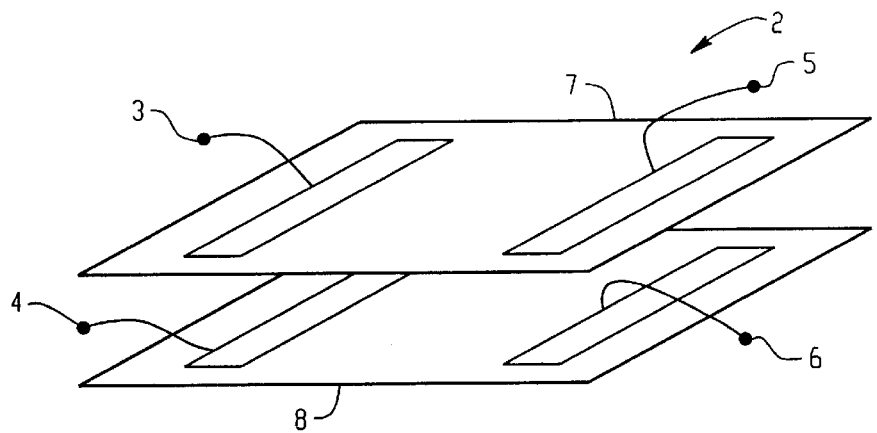
FIG. 1 is a simplified schematic view of a four terminal capacitor.
Figure 2:
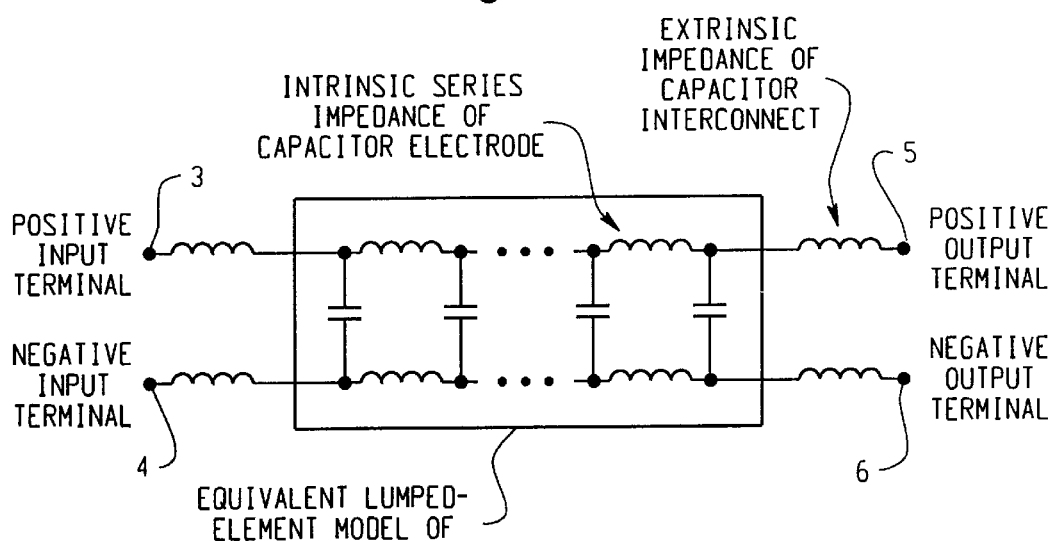
FIG. 2 is a preferred electrical circuit representation of a four terminal capacitor.
Figure 3:
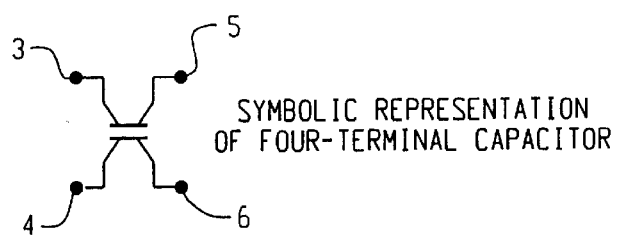
FIG. 3 is a symbolic representation of a four terminal capacitor.

Referring now to the drawings, FIG. 1 sets forth a simplified schematic view of a preferred embodiment of the multi-terminal capacitive structure of the present invention. The preferred multi-terminal capacitive structure is a four-terminal capacitor 2. An electrical circuit representation of the preferred structure is shown in FIG. 2 and a symbolic representation is shown in FIG. 3. The four-terminal capacitor 2 includes a positive input terminal 3, a negative input terminal 4, a positive output terminal 5, and a negative output terminal 6 all of which are coupled to a plurality of electrodes 7, 8. Between the electrodes 7, 8 is a dielectric layer (not shown).

The preferred four-terminal capacitor 2 is implemented using a multi-layer thin film capacitor structure. An exemplary multi-layer capacitor structure that is useful for the present invention is shown in commonly assigned U.S. Pat. No. 5,745,335, which is incorporated herein by reference.

The multi-terminal capacitor structure of the present invention is much improved over the typical two-terminal capacitor structure for noise reduction applications because, among other things, the multi-terminal capacitor structure provides the ability to utilize multiple connection terminals on a given capacitor. In the four-terminal capacitor structure of the preferred embodiment, two input terminals and two output terminals are defined. In a decoupling application, the input terminals provide coupling points for the positive and common polarities of a system DC power supply, and the output terminals provide coupling points for a local sub-component within the system that receives DC power. In another embodiment of a multi-terminal capacitor structure, a three terminal capacitor structure, the structure is provided with a positive input terminal, a positive output terminal, and a common negative input/output terminal. In an alternate embodiment of a three terminal capacitor structure, the structure is provided with a negative input terminal, a negative output terminal, and a common positive input/output terminal.

The multi-terminal capacitor structure is much improved in attenuating high-frequency electrical disturbances superimposed on the DC supply which may be present at the input terminals. The multi-terminal capacitor structure improved attenuating ability is achieved in large part by forcing the DC power from the DC supply that is to be supplied to the local sub-component to feed through the capacitor electrodes from the input side of the electrodes to the output side of the electrodes. The capacitor electrodes function as a form of transmission line that attenuates high-frequency energy. As a result, the desired noise attenuating ability of the multi-terminal capacitor is not limited by the electrical leads that are connected to the capacitor terminals as is the case with traditional two-terminal discrete capacitors. In addition, the noise attenuation provided by the multi-terminal capacitor structure is achievable over a much broader range of frequencies than that which is possible with a conventional two-terminal discrete capacitor. Furthermore, a greater level of attenuation can be achieved by lengthening the distance between the input and output terminals. The potential increase in the DC power supply resistance caused by the lengthening of the distance between the input and output leads can be compensated for by increasing the width of the capacitor electrodes.

Figure 4:
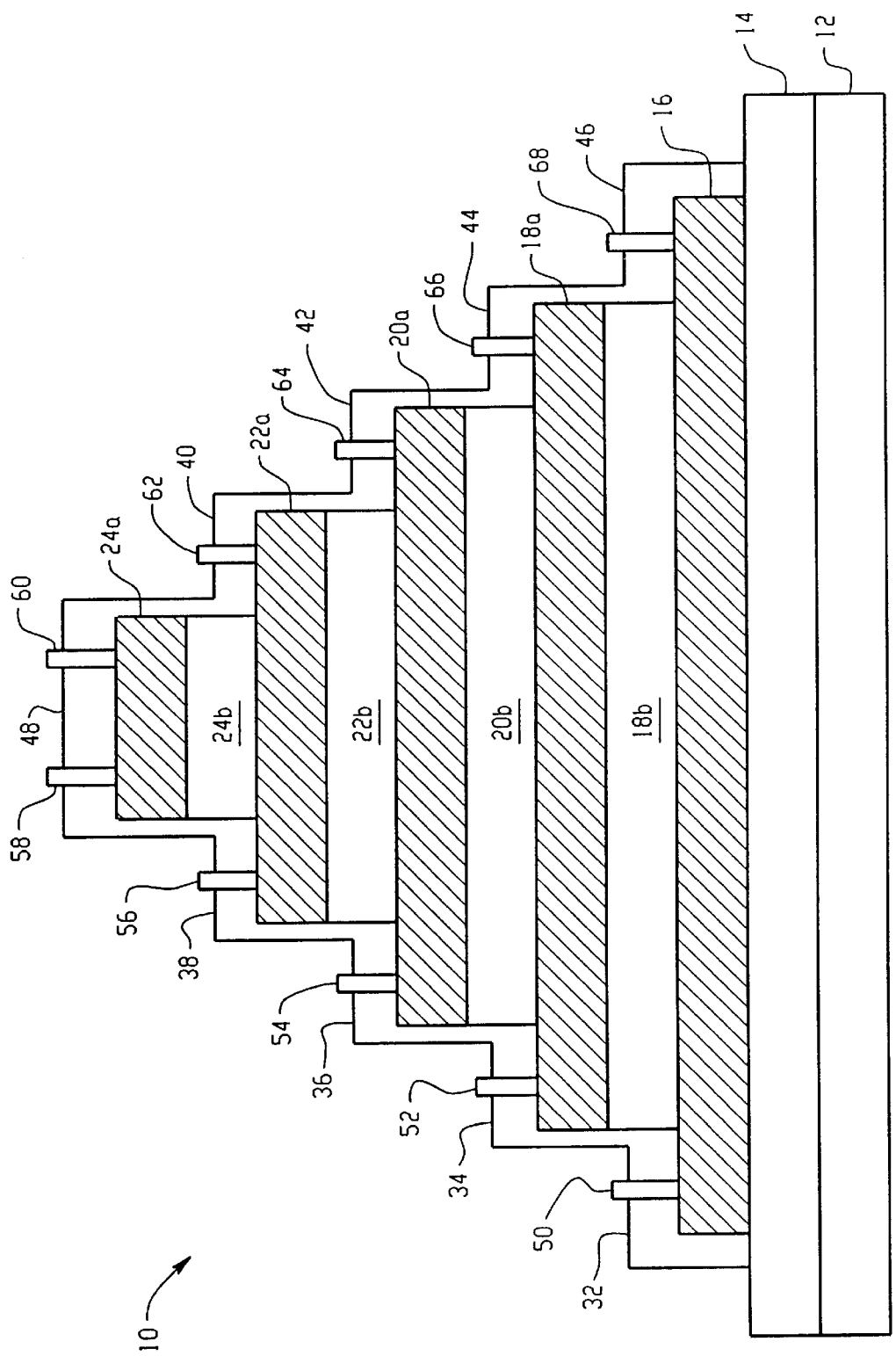
FIG. 4 is a cross-sectional view of a preferred four terminal capacitor.

With Reference to FIG. 4, the preferred multi-terminal capacitor structure is a multi-layer thin film distributed capacitance structure 10. Structure 10 includes a conventional substrate 12 (e.g. of silicon or any other suitable material) covered by an insulation layer 14 (e.g. of silicon dioxide or any other suitable insulator material).

A bottom electrode layer 16, formed of any suitable metal (e.g. nickel, platinum or palladium) is formed on top of insulation layer 14. The surface area of bottom electrode layer 16 is not as large as the surface area of insulation layer 14 thereby leaving a portion of the underlying insulation layer 14 exposed.

Above bottom electrode layer 16 are successive pairs of intermediate electrode layers/dielectric layers 18a, 18b, 20a, 20b, and 22a, 22b. Above the upper intermediate layers 22a, 22b are top layers 24a, 24b (layer 24a being an electrode layer and layer 24b being a dielectric layer). The surface area of each successive layer is smaller than the surface area of the layer immediately underlying it thereby leaving a portion of each layer exposed.

Figure 5:
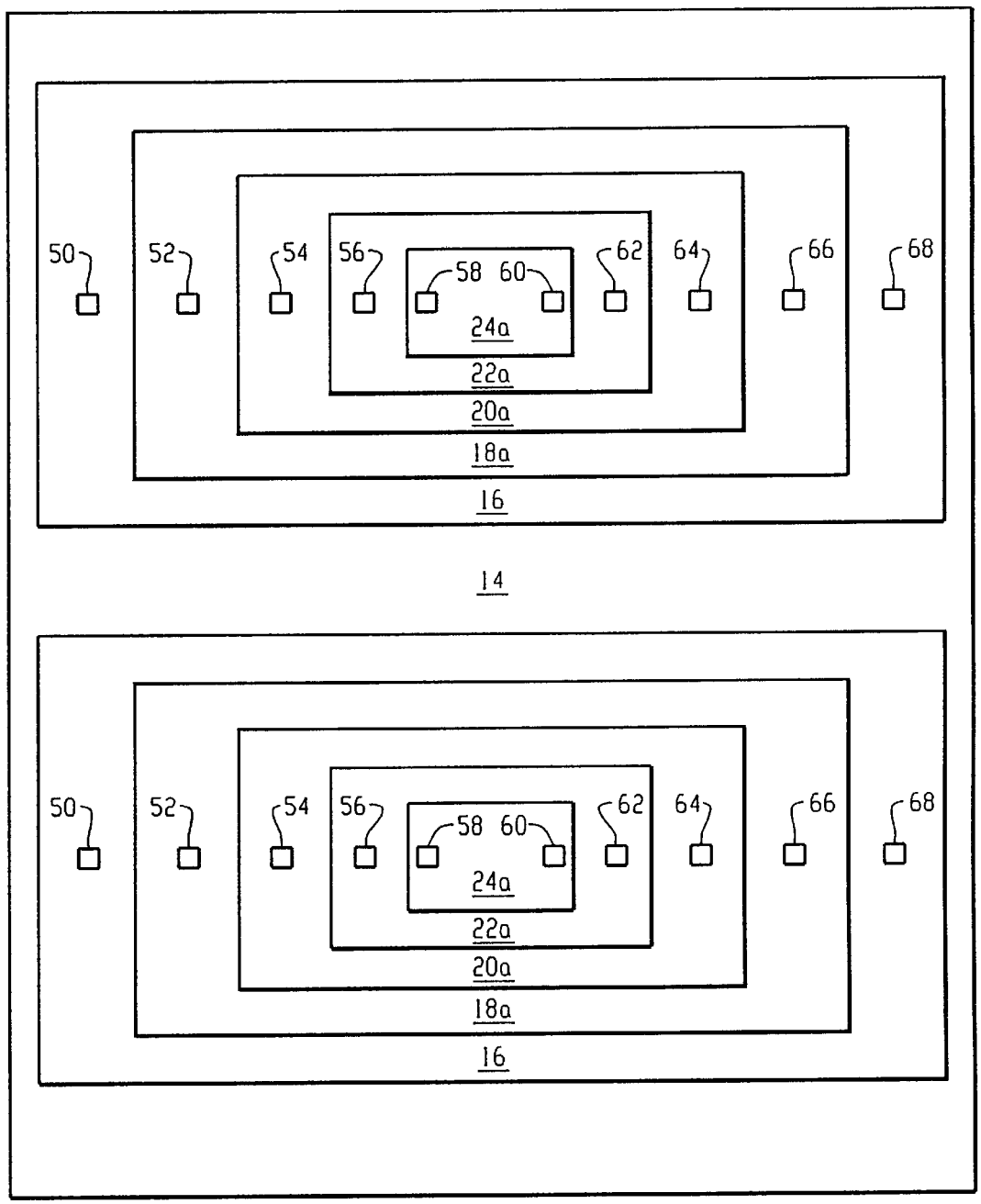
FIG. 5 is a plan view of a preferred four terminal capacitor without the outer insulating layer.

As shown in FIGS. 4 and 5, the layers 16 and 18a, 18b to 24a, 24b are arranged in a mesa structure. In a mesa structure, the pairs of layers become progressively larger from top to bottom so that the top surface of each lower layer pair is larger than the bottom surface of each layer above it and extends laterally beyond the layer above it in all horizontal dimensions.

After the mesa structure of electrode and dielectric layers has been formed, the entire structure is covered with a layer of insulation 26 (shown in FIG. 4), typically silicon dioxide. Since the insulation layer 26 follows the stepped pattern of the mesa, the insulation layer 26 defines a set of annular horizontal surfaces 30, 32, 34, 36, 38, 40, 42, 44, and 46 over the projecting edges of each electrode layer 16, 18a, 20a, 22a. Windows or vias are opened in the horizontal annular surfaces 30 to 46 and in the top horizontal surface 48 through which contacts 50, 52, 52, 54, 56, 58, 60, 62, 64, 66, and 68 are established (typically of gold or other suitable conductive material) to the electrodes 16, 18a, 20a, 22a, and 24a.

Figure 6:
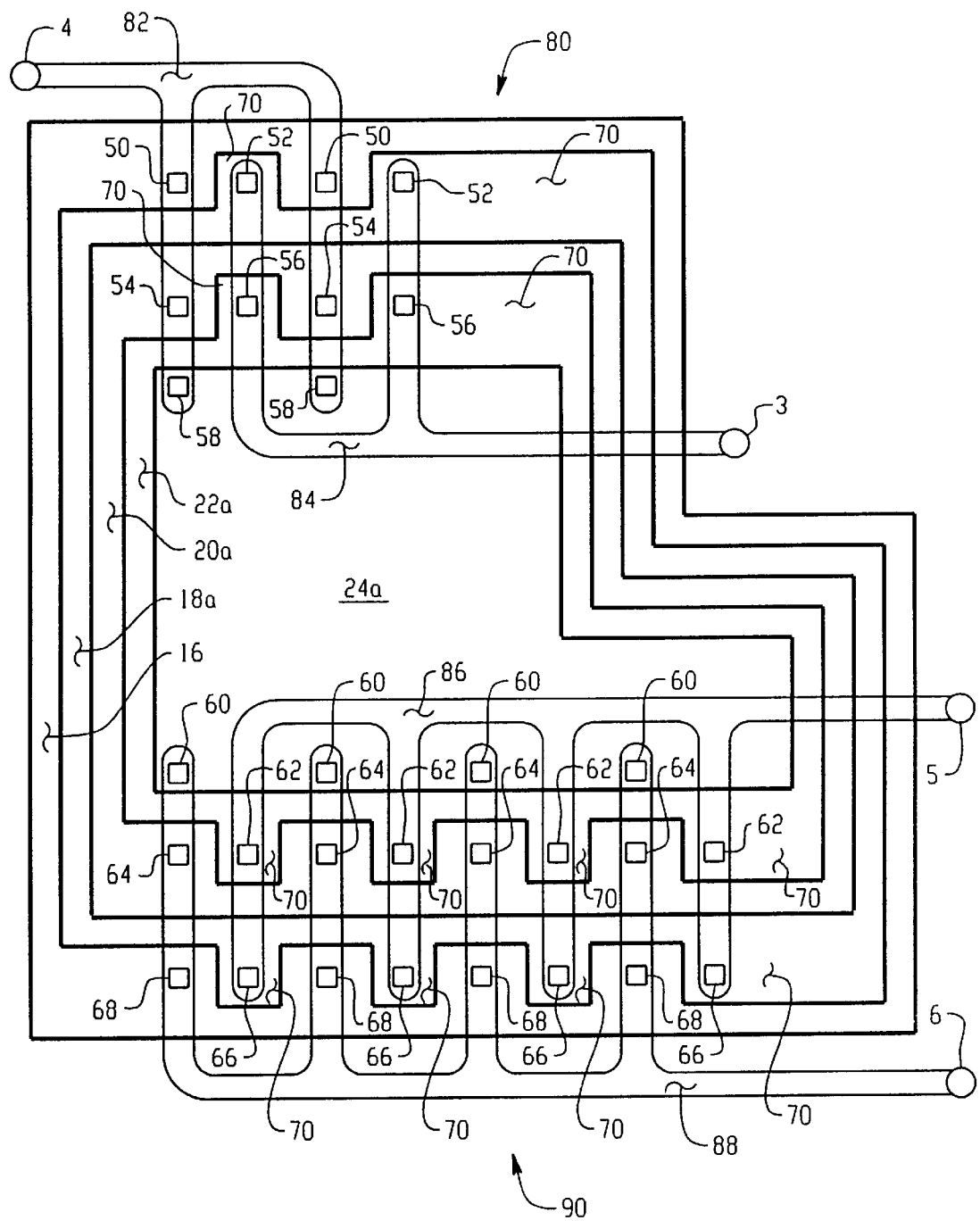
FIG. 6 is a layout view of a preferred four terminal capacitor.

Shown in FIGS. 6 is a layout drawing of a preferred four-terminal capacitor structure. The structure includes a bottom electrode layer 16, successive pairs of intermediate electrode layers 18a, 18b, 20a, 20b, and 22a, 22b, each of which overlie dielectric layers (not shown), and a top layers 24a that overlies a dielectric layer (not shown). The surface area of each successive layer is smaller than the surface area of the layer immediately underlying it thereby leaving a portion of each layer exposed. Each electrode layer 16, 18a, 20a, 22a, and 24a has an input side 80 and an output side 90. In addition, the outer periphery of the input side and output side of layers 18a and 22a include a plurality of laterally projecting surfaces 70 that extend further over the underlying layer than the remainder of the respective side portions of that layer.

The capacitor structure also includes a plurality of contacts 50, 52, 52, 54, 56, 58, 60, 62, 64, 66, and 68 in each electrode layer. For example, layer 16 includes two contacts 50 on the input side and four contacts 68 on the output side. Likewise, the other layers in this embodiment include two contacts on the input side and four contacts on the output side.

Electrical traces are used to couple the contacts to the input and output terminals. In the embodiment shown, trace 82 couples contacts 50, 54, and 58 to the negative input terminal 4. Trace 84 couples contacts 52 and 56 to the positive input terminal 3. Trace 86 couples contacts 62 and 66 to the positive output terminal 5. And, trace 88 couples contacts 60, 64, and 68 to the negative output terminal 6.

The outer projecting surfaces 70 provide surfaces on which contacts 52 and 56 on the input side and contacts 62 and 66 on the output side can be located. An advantage of this structural arrangement is that it allows positive polarity contacts to be in close proximity to negative polarity contacts thereby forming regions of high quality capacitance with very low intrinsic series resistance or inductance. These regions will be very effective in attenuating high frequency disturbances which pass through to the output terminals.

As shown in FIG. 6, access is permitted at a plurality of locations on each of the input and output side of each layer, resulting in customization flexibility, optimization of parametric and reliability performance of each capacitor structure, and production efficiency. While three pairs of intermediate electrode/dielectric layers have been shown, it will be realized that any desired number of intermediate layers can be provided. In addition the mesa can be of any shape, e.g. square, rectangular, round, elliptical, triangular, or L-shaped. A further advantage of the mesa structure with contacts at the exposed edges is that it is not necessary to have openings through dielectric layers, which could cause defects and adhesion problems.

Also as shown in FIG. 5, multiple capacitor structures can be formed on a single substrate. Each capacitive structure can be formed independent of the other structures to have different numbers of layers and different contact coupling arrangements.

The impedance looking into the output terminals 5, 6 can be optimized, for example, by increasing or decreasing the number of local contacts and by adjusting the width of the electrical traces 86 and 88 leading to the contacts.

Similarly, the impedance looking into the input terminals 3, 4 can be tuned to the source impedance, for example, by using the sheet resistance of the capacitor electrodes to full advantage. An effective termination resistance of several Ohms can be realized by increasing the aspect ratio of the capacitor region where the connection is made. A long, narrow region of capacitor electrode will introduce several squares of sheet resistance, a value which can be tuned to the equivalent source impedance looking back in the system's DC power supply.

All of the electrode and dielectric layers shown are film layers, deposited by conventional techniques such as sputtering, chemical vapor deposition, evaporation, or spin-on techniques, all of which are well-known in the art. The electrode and dielectric layers are preferably thin film layers with very small thicknesses, typically in the order of 0.03 to 1.0.mu.m, although they can be thicker if desired. The intermediate and top electrode layers are, like the bottom electrode layer 16, of any suitable metal such as platinum and/or palladium. The dielectric layers are of any desired suitable material. One class of materials which has been found to be particularly suitable is the class known as ferroelectric materials, also called polar dielectric materials, such as those disclosed in U.S. Pat. No. 5,206,788 and which are well-known in the art for capacitors. Examples of ferroelectric or polar dielectric materials are lead zirconate titanate compositions. As is well known ferroelectric (polar) dielectric materials exhibit spontaneous polarization at temperatures below their Curie temperature.

Another advantage of the preferred structure is that because it is formed using thin film technology, it is highly adaptable for use in flip chip mounting. Flip chip mounting further increases the advantages of the present invention in filtering noise. Through the use of flip-chip compact bump technology, lead lengths can be minimized. The reduced lead lengths will result in decreased circuit inductance and resistance of a system using the present invention.

Figure 7:
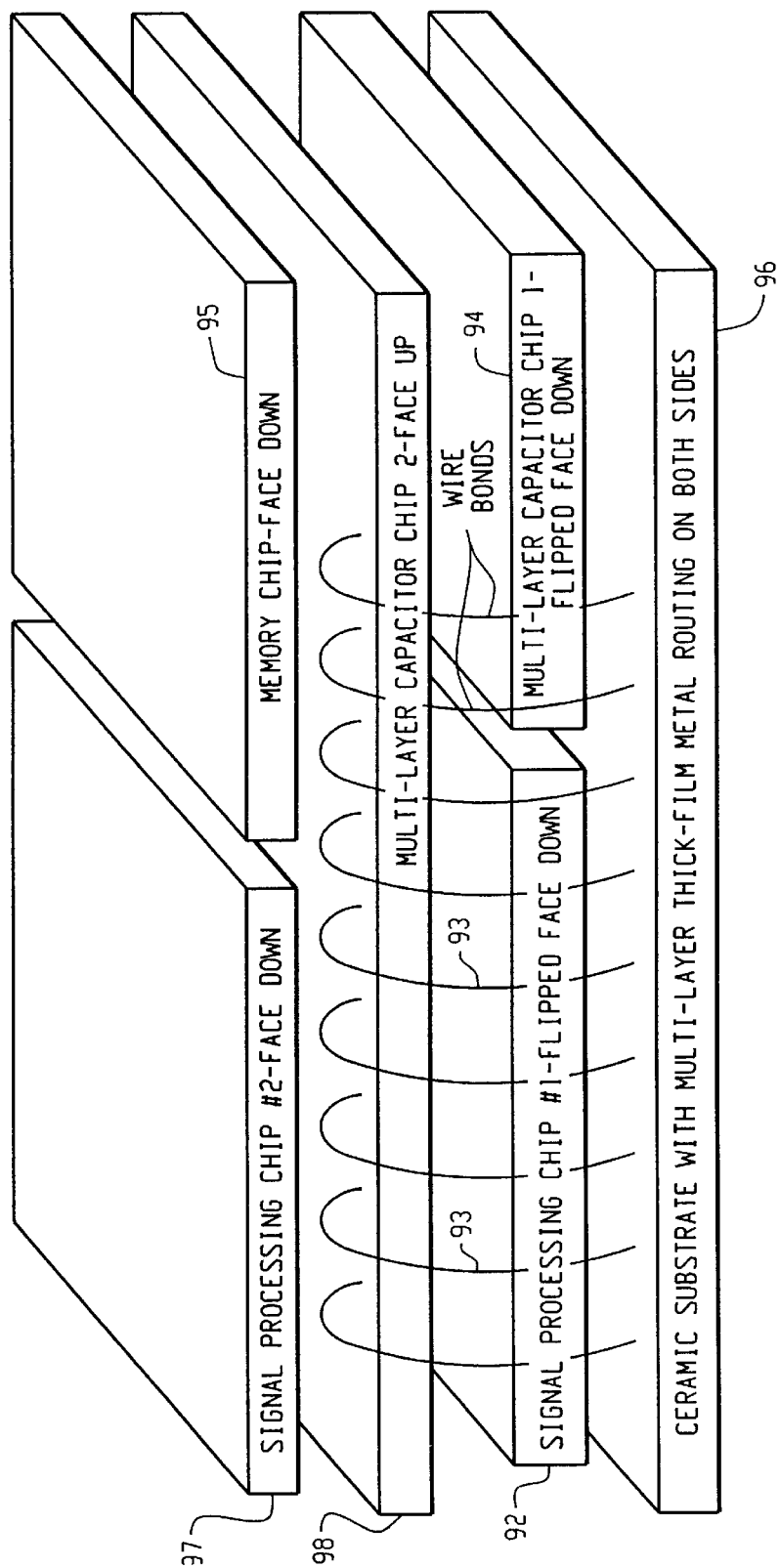
FIG. 7 is an exploded view of a preferred circuit assembly that incorporates multi-terminal capacitors.

As shown in FIG. 7, a signal processing chip 92 and a multi-layer capacitor chip 94 are mounted onto a substrate 96 that has multi-layer thick-film metal routing on both sides. Input DC power is routed through the substrate 96 to the capacitor chip 94. Decoupled DC power is then routed from capacitor chip 94 to signal processing chip 92. Multi-layer capacitor chip 98 is provided with DC power through wire bonds 93. Memory chip 95 and signal processing chip 97 are flip chip mounted onto multi-layer capacitor chip 98. Multi-layer capacitor chip 98 provides decoupled DC power to memory chip 95 and signal processing chip 97 through contacts accessible through their top surfaces.

Signal processing chips 92 and 97 and memory chip 95 contain multiple circuit blocks, each running on different power supplies. In such a case, the multi-layer capacitor chips 94 and 98 can comprise a plurality of capacitor structures wherein each capacitor structure provides power to and electrically isolates one of the circuit blocks.

Figure 8:
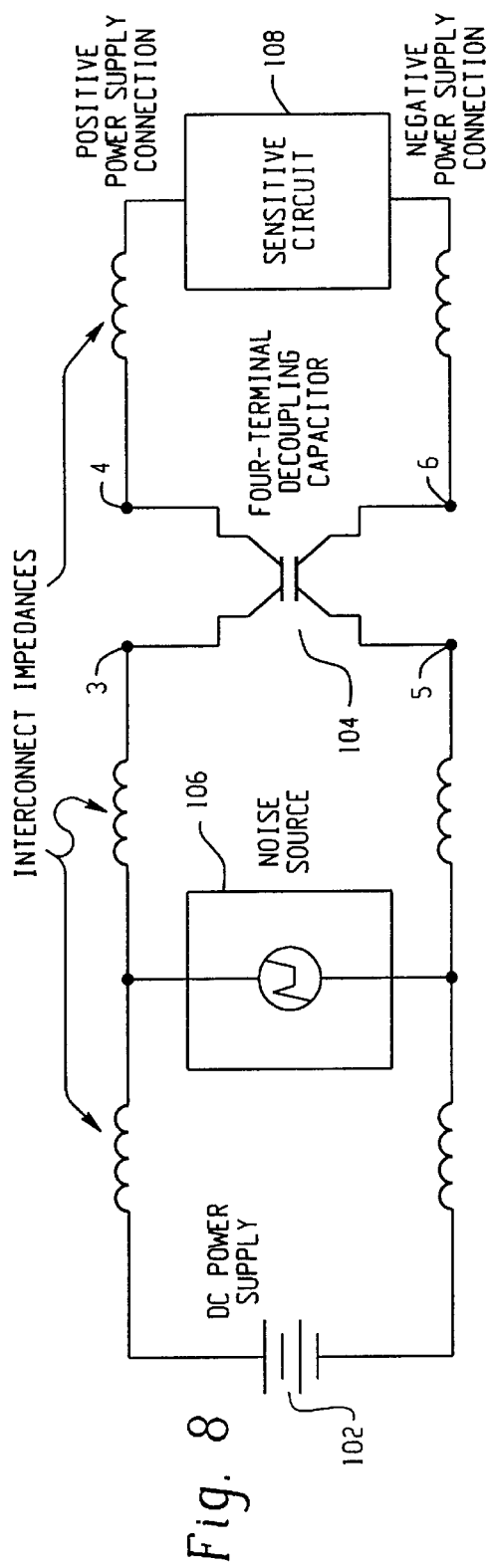
FIG. 8 is schematic view of a system utilizing a four terminal capacitor as a decoupling capacitor.

An example of the use of the multi-terminal capacitor structure in a decoupling application is shown in FIG. 8. System power from a DC power supply 102 is provided at the input terminals 3, 4 of the capacitor 104 and is delivered to the output terminals 4, 5 via the low-resistance paths through the upper and lower electrodes of the capacitor structure 104. The DC power supplied at the input terminals 3, 4 is potentially noisy because of the injection of noise from some other sub-component 106 of the system. By forcing the supply voltage to flow through the capacitor electrodes, high-frequency transients are attenuated by the intrinsic capacitor structure. The DC power available at the output terminals 4, 5 is thus a "cleaner" source for the sub-component 108 it supplies; the high-frequency noise that was originally present at the input terminals has been substantially attenuated by the capacitance. The impedance of the input leads does not affect the attenuation transfer characteristic, which is a key advantage over two terminal capacitors.

Figure 9:
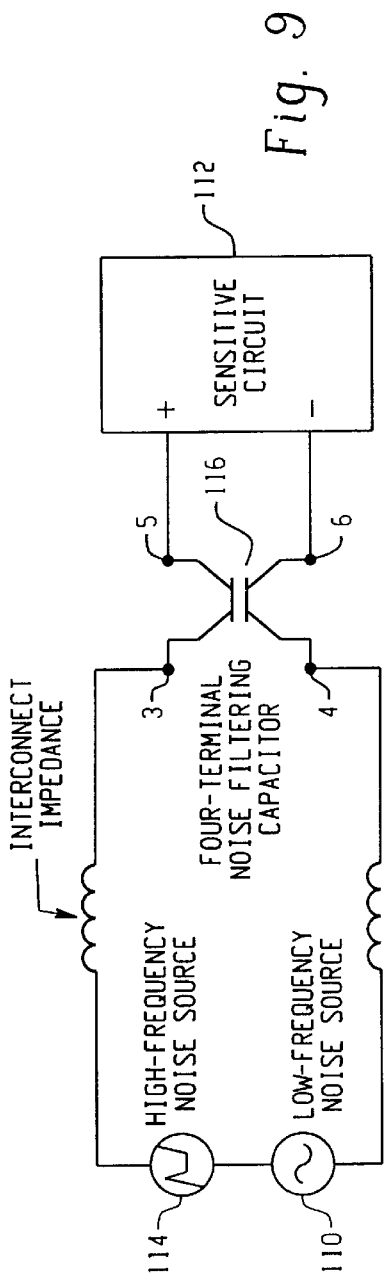
FIG. 9 is a schematic view of a system utilizing a four terminal capacitor as a filtering capacitor.

An example of the use of the multi-terminal capacitor structure in another filtering application is shown in FIG. 9. A low frequency signal source 110 provides a signal to a sensing circuit 112. Another component 114 of the system generates high frequency noise that degrades the quality of the original signal. The original signal with the high frequency noise is fed to the multi-terminal capacitor 116. The signal flows through the capacitor electrodes from the input terminals to the output terminals. The capacitor 116 thereby attenuates the noise and provides a cleaner signal to the sensing circuit 112.

Gennum's multi-layer film capacitors are created using a photolithographic process that allows the geometry of any capacitor to be customized on an application-specific or product-specific basis. This includes the flexibility to adjust the equivalent series resistance and inductance of each physical connection. Therefore, the limitations which electrical leads impose on the high-frequency performance of capacitors can be ameliorated, for example, by increasing the width of connections to capacitor electrodes and by placing multiple physical contacts in parallel at each connection point.

A further advantage of the technology is the ability to independently customize the equivalent impedance looking into different pairs of terminals of the capacitor. For example, it is possible to increase the series resistance looking into the input terminals of a decoupling capacitor constructed in accordance with the present invention to minimize reflections of high-frequency disturbances present on the power supply. Similarly the output terminals of the same capacitor structure can be configured to have very low series resistance, improving the ability of the capacitor to attenuate disturbances induced on the local DC power supply lines and to prevent those disturbances from leaking out to other sub-components in the system.

The photolithographic means by which a capacitor is created places no limits on the number of terminals which can be attached to each electrode of the capacitor. Further, the layout style of the terminals can be optimized to increase the size and effectiveness of the surrounding local capacitance.

Having described in detail the preferred and alternate embodiments of the present invention, including preferred modes of operation, it is to be understood that this invention and operation could be constructed and carried out with different elements and steps. The preferred embodiments are presented only by way of example and are not meant to limit the scope of the present invention, which is defined by the following claims.

What is claimed:

1. A thin film capacitive device comprising:
   a first set of terminals comprising a positive input terminal and a negative input terminal;
   a second set of terminals comprising a positive output terminal and a negative output terminal;
   a first electrode assembly coupled between the positive input terminal and the positive output terminal; and
   a second electrode assembly coupled between the negative input terminal and the negative output terminal;
   wherein at least one of the positive input terminal and positive output terminal is coupled to the first electrode assembly at multiple coupling locations by multiple traces, and at least one of the negative input terminal and negative output terminal is coupled to the second electrode assembly at multiple coupling locations by multiple traces, and the geometry of the multiple traces and the number of the coupling locations for the at least one positive and negative input terminals and positive and negative output terminals contributes to achieving a desired input or output impedance, respectively, for the capacitive device;
   whereby electrical energy available at the second set of terminals flows from the first set of terminals to the second set of terminals across said first and second electrode assemblies.

2. The capacitive device of claim 1 wherein the geometry of the multiple traces of the coupling locations for the at least one positive and negative input terminals and positive and negative output terminals comprises the width of the traces.

3. The capacitive device of claim 1 wherein tuning the input impedance by selecting a sheet resistance of the first and second electrode assemblies further contributes to achieving a desired input impedance for the capacitive device.

4. The capacitive device of claim 1 wherein the first electrode assembly comprises a plurality of electrodes and wherein the second electrode assembly comprises a plurality of electrodes.

5. The capacitive device of claim 4 wherein the positive input terminal is coupled to each electrode of the first electrode assembly at multiple coupling locations and wherein the negative input terminal is coupled to each electrode of the second electrode assembly at multiple coupling locations.

6. The capacitive device of claim 5 wherein the positive output terminal is coupled to each electrode of the first electrode assembly at multiple coupling locations and wherein the negative output terminal is coupled to each electrode of the second electrode assembly at multiple coupling locations.

7. The capacitive device of claim 4 wherein the positive output terminal is coupled to each electrode of the first electrode assembly at multiple coupling locations and wherein the negative output terminal is coupled to each electrode of the second electrode assembly at multiple coupling locations.

8. A thin film capacitive device comprising:
   a first set of terminals comprising a positive input terminal and a negative input terminal;
   a second set of terminals comprising a positive output terminal and a negative output terminal;
   a first electrode assembly coupled between the positive input terminal and the positive output terminal; and
   a second electrode assembly coupled between the negative input terminal and the negative output terminal;
   wherein the first electrode assembly includes an input side and an output side, and the positive input terminal is coupled to the first electrode assembly on the input side of the first electrode assembly and the positive output terminal is coupled to the first electrode assembly on the output side of the first electrode assembly, and wherein the distance between a coupling location of the positive input terminal and a coupling location of the positive output terminal is at least equal to or greater than half the distance between opposite edges of the input side and output side of the first electrode assembly;
   whereby electrical energy available at the second set of terminals flows from the first set of terminals to the second set of terminals across said first and second electrode assemblies.

9. A thin film capacitive device comprising:
   a first set of terminals comprising a positive input terminal and a negative input terminal;
   a second set of terminals comprising a positive output terminal and a negative output terminal;
   a first electrode assembly coupled between the positive input terminal and the positive output terminal; and
   a second electrode assembly coupled between the negative input terminal and the negative output terminal;
   wherein the second electrode assembly includes an input side and an output side, and the negative input terminal is coupled to the second electrode assembly on the input side of the second electrode assembly and the negative output terminal is coupled to the second electrode assembly on the output side of the second electrode assembly and wherein the distance between a coupling location of the negative input terminal and a coupling location of the negative output terminal is at least equal to or greater than half the distance between opposite edges of the input side and output side of the second electrode assembly;

whereby electrical energy available at the second set of terminals flows from the first set of terminals to the second set of terminals across said first and second electrode assemblies.

10. A thin film capacitive device comprising:

a first set of terminals comprising a positive input terminal and a negative input terminal;

a second set of terminals comprising a positive output terminal and a negative output terminal;

a first electrode assembly coupled between the positive input terminal and the positive output terminal; and a second electrode assembly coupled between the negative input terminal and the negative output terminal;

wherein the second electrode assembly includes an input side and an output side, and wherein the negative input terminal is coupled to the second electrode assembly on the input side of the second electrode assembly and the negative output terminal is coupled to the second electrode assembly on the output side of the second electrode assembly, and wherein the distance between a coupling location of the negative input terminal and a coupling location of the negative output terminal is at least equal to or greater than half the distance between opposite edges of the input side and output side of the second electrode assembly;

whereby electrical energy available at the second set of terminals flows from the first set of terminals to the second set of terminals across said first and second electrode assemblies.

11. A thin film capacitive device comprising:

a first set of terminals comprising a positive input terminal and a negative input terminal;

a second set of terminals comprising a positive output terminal and a negative output terminal;

a first electrode assembly coupled between the positive input terminal and the positive output terminal; and a second electrode assembly coupled between the negative input terminal and the negative output terminal;

whereby electrical energy available at the second set of terminals flows from the first set of terminals to the second set of terminals across said first and second electrode assemblies, and wherein the device is formed on a substrate and wherein the second electrode assembly comprises a first film electrode layer disposed above the substrate and the first electrode assembly comprises a second film electrode layer, the device further comprising a layer of film dielectric material disposed between the first film electrode layer and the second film electrode layer.

12. The device according to claim 11 further comprising at least one pair of additional layers of a film electrode and a film dielectric material overlying the second film electrode layer.

13. The device according to claim 12 wherein each film electrode layer has an input side and an output side.

14. The device according to claim 11 further comprising at least one pair of additional layers of a film electrode and a film dielectric material disposed between the first film electrode layer and the substrate.

15. A capacitive device formed on a substrate comprising:

a first set of terminals comprising a positive input terminal and a negative input terminal;

a second set of terminals comprising a positive output terminal and a negative output terminal;

a first film electrode layer disposed above the substrate and having an input side and an output side, the input side having means for providing a coupling location for the negative input terminal, the output side having means for providing a coupling location for the negative output terminal;

a second film electrode layer also disposed above the substrate and having an input side and an output side, the input side having means for providing a coupling location for the positive input terminal, the output side having means for providing a coupling location for the positive output terminal; and a layer of film dielectric material disposed between the first film electrode layer and the second film electrode layer.

16. The capacitive device according to claim 15 wherein the first film electrode layer is disposed above the second film electrode layer.

17. The capacitive device according to claim 15 wherein the second film electrode layer is disposed above the first film electrode layer.

18. The capacitive device according to claim 15 further comprising a first additional pair of layers of film electrode material and film dielectric material disposed above the first and second film electrode layers, the first additional layer of film electrode material having an input side and an output side, the input side having a connection portion for providing a coupling location for one of the positive or negative input terminals, the output side having a connection portion for providing a coupling location for one of the positive or negative output terminals.

19. The capacitive device of claim 15 wherein at least one film electrode layer has multiple coupling locations for coupling to one of the input terminals and wherein at least one film electrode layer has multiple coupling locations for coupling to one of the output terminals.

20. The capacitive device of claim 19 wherein the number of coupling locations for the input terminals contributes to achieving a desired input impedance for the capacitive device.

21. The capacitive device of claim 20 wherein the geometry of at least one of the coupling locations for the input terminals contributes to achieving a desired input impedance for the capacitive device.

22. The capacitive device of claim 19 wherein the number of coupling locations for the output terminals contributes to achieving a desired output impedance for the capacitive device.

23. The capacitive device of claim 22 wherein the geometry of at least one of the coupling locations for the output terminals contributes to achieving a desired output impedance for the capacitive device.

24. An electronic assembly comprising (a) an integrated circuit device having a first body, a top surface of the first body and a plurality of pads coupled to circuitry within the first body and (b) a capacitive device formed on a substrate and having a capacitive device body and a plurality of capacitive device pads extending out of the capacitive device body, the capacitive device body including:

a first set of terminals comprising a positive input terminal and a negative input terminal;

a second set of terminals comprising a positive output terminal and a negative output terminal;

a first film electrode layer disposed above the substrate and having an input side and an output side, the input side having means for providing a coupling location for the negative input terminal, the output side having means for providing a coupling location for the negative output terminal;

a second film electrode layer also disposed above the substrate and having an input side and an output side, the input side having means for providing a coupling location for the positive input terminal, the output side having means for providing a coupling location for the positive output terminal; and a layer of film dielectric material disposed between the first film electrode layer and the second film electrode layer;

wherein the positive output terminal and the negative output terminal are each coupled to at least one of the capacitive device pads; mounted on the top surface of the integrated circuit.

* * * * *